(12) United States Patent  (10) Patent No.: US 8,368,217 B2
Miller et al.  (45) Date of Patent: Feb. 5, 2013

(54) INTEGRATED CIRCUIT PACKAGE WITH SEGREGATED TX AND RX DATA CHANNELS

(75) Inventors: Michael J. Miller, Saratoga, CA (US); Mark William Baumann, Campbell, CA (US); Richard S. Roy, Dublin, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/541,658

(22) Filed: Jul. 3, 2012

(65) Prior Publication Data

US 2012/0267769 A1 Oct. 25, 2012

Related U.S. Application Data

(63) Continuation of application No. 12/846,763, filed on Jul. 29, 2010.

(51) Int. Cl.
  *H01L 23/48* (2006.01)
(52) U.S. Cl. .................. 257/738; 257/E23.01
(58) Field of Classification Search .......... 257/777–778, 257/685–686, 737–738, 691–692, 684, E23.01, 257/E23.069, E23.129; 370/252, 255; 710/110
  See application file for complete search history.

(56) References Cited

U.S. PATENT DOCUMENTS

| | | | |
|---|---|---|---|
| 5,281,151 A | 1/1994 | Arima et al. | |
| 5,640,048 A | 6/1997 | Selna | |
| 5,880,987 A | 3/1999 | Merritt | |
| 6,687,842 B1 | 2/2004 | DiStefano et al. | |
| 6,730,540 B2 | 5/2004 | Siniaguine | |
| 6,747,362 B2 | 6/2004 | Barrow | |
| 7,663,903 B2 | 2/2010 | Kang et al. | |
| 7,786,591 B2 | 8/2010 | Khan et al. | |
| 7,829,997 B2 | 11/2010 | Hess et al. | |
| 7,863,738 B2 | 1/2011 | Romig et al. | |
| 8,004,070 B1 | 8/2011 | Chen | |
| 8,049,303 B2 | 11/2011 | Osaka et al. | |
| 2005/0098886 A1 | 5/2005 | Pendse | |
| 2006/0091542 A1 | 5/2006 | Zhao et al. | |
| 2006/0273468 A1 | 12/2006 | Mahajan et al. | |
| 2009/0072856 A1* | 3/2009 | Subramaniam et al. | 326/38 |
| 2009/0245110 A1* | 10/2009 | Connolly et al. | 370/236 |
| 2009/0256267 A1 | 10/2009 | Yang et al. | |
| 2010/0102434 A1 | 4/2010 | Kang et al. | |
| 2010/0314761 A1 | 12/2010 | Yoshikawa et al. | |
| 2010/0327457 A1 | 12/2010 | Mabuchi | |
| 2011/0049710 A1 | 3/2011 | Kao et al. | |

(Continued)

OTHER PUBLICATIONS

Optical Internetworking Forum, Optical Internetworking Forum, "IA Title : Common Electrical I/O (CEI)—Electrical and Jitter Interoperability agreements for 6G+ bps and 11G+ bps I/O, IA # OIF-CEI-02. 0", Feb. 28, 2005, pp. 98-100, Fremont, CA, USA.

*Primary Examiner* — Hoa B Trinh
(74) *Attorney, Agent, or Firm* — MoSys Legal Dept.

(57) ABSTRACT

A chip layout isolates Rx terminals and Rx ports from Tx terminals and Tx ports. Tx terminals are grouped contiguously to each other, and are segregated as a group to a given edge of the package, Rx terminals are similarly grouped and segregated to a different edge of the package. Tx and Rx data channels are disposed in a respective single layer of the package, or both are disposed in a same single layer of the package. Rx ports and Tx ports are located at an approximate center of the package, with Tx and Rx ports disposed on respective opposite sides of an axis bisecting the package. Data signals received by, and transmitted from, the chip flow in a same direction, from a first edge of the package to the center of the package and from the center of the package to a second edge of the package, respectively.

20 Claims, 12 Drawing Sheets

U.S. PATENT DOCUMENTS

2011/0057291 A1 3/2011 Slupsky et al.
2011/0121443 A1 5/2011 Danno et al.
2011/0193227 A1 8/2011 Chuang et al.
2011/0298127 A1 12/2011 Seta et al.

* cited by examiner

INTEGRATED CIRCUIT PACKAGE WITH SEGREGATED TX AND RX DATA CHANNELS

CROSS-REFERENCE TO RELATED APPLICATIONS

This application is a continuation application and claims priority to U.S. utility application Ser. No. 12/846,763, filed Jul. 29, 2010, entitled "Semiconductor Chip Layout," which application is incorporated by reference herein in its entirely.

BACKGROUND

Current memory circuits that use double data rate (DDR) and quadruple data rate (QDR) access schemes have separate address, write data, read data and status pins. These access schemes require high frequency data transmission links that provide low bit error rate (BER), high bandwidth and low on-chip latency. Bandwidth is the amount of information exchanged during read and write operations. Latency is the time lapsed between an event in an input signal and a corresponding event in an output signal that results from the event in the input signal. For example, in a memory circuit latency is the time lapsed between the receipt of a 'Read' command at an input pin of the memory circuit and the transmission of the corresponding read data to the output pins of the memory circuit.

In a device that has a serial transmission link one or more serializer-deserializer (SERDES) circuits convert data packets between serial and parallel formats. It is common practice to place the SERDES circuits and other associated logic components along the periphery of the silicon chip. Such architecture results in a wide spread in latencies in the silicon, depending on the distance between the SERDES and the specific functional block that is the source or the destination of the data. Thus, worst case timing latency is determined by the longest path set by the I/O which is the furthest away from any one device resource. A typical layout of I/O at the periphery would result in the worst case path from one corner of the die to the opposite corner. The resulting distance that an input signal must traverse could be the width plus the height of the die.

Error rates are expected to increase for high speed data links. Many circuits have a cyclic redundancy check (CRC) circuit to perform error checking on data packets. Error checking is performed across the entire data packet, which may be striped across multiple data lines to increase bandwidth and to reduce latency. However, such an approach requires that multiple data lines converge into the CRC circuit to allow error checking, thus adding to the length of the traces that signals must traverse for an operation.

Moreover, heaviest packet traffic in a device typically occurs as communication among functional blocks formed in or on the silicon substrate. Data lines formed in or on the silicon substrate are dimensionally constrained, thus representing significant capacitive and resistive loads to the paths the signals must traverse. In addition, communication lines in or on silicon further need to circumvent the functional blocks that create barriers to signal routing, adding to the lengths of the communication lines. As a result, on die packet traffic routed through communication lines on a silicon substrate with a significant density of functional blocks will experience increased latencies.

In an application using a SERDES circuit, placement of a power pin next to a data pin in a package substrate complicates "signal escape" to an external component. Routing signals in a printed circuit board from a signal pad at the center of the chip through a "picket fence" of power pins exposes the data signal on the signal pad to interference, cross-talk, and distortion. Thus packages where the signal pins are toward the outer edges of the packet reduce the picket fence effect. To overcome the above problem, it is customary to place I/O signals at the edge of the silicon substrate. However such placement can negatively impact the overall latency of the circuit. Package pin-out configuration is a concern in integrated circuit design.

Tx/Rx differential pairs are typically grouped closely together in high speed communication systems. Each Tx transmitter includes a transmit channel that conveys read data and status information out of a package. Each Rx receiver includes a receive channel that receives address, control and write data from outside of the package. In networking devices, the proximity of Tx and Rx channels can result in data crosstalk and an increase in bit flips.

Bandwidth becomes more significant when a SERDES block is combined with a high speed memory block. Due to the proximate locations of Tx to Rx, a conventional systems have a significantly limited signal line density, which adversely affects the available bandwidth. In high speed communication systems, it is increasingly critical to have a significant amount of line/signal density for improving the device bandwidth.

U.S. Pat. No. 7,405,946 to Hall et al. ("Hall") separates transmitter contacts from receiver contacts in a high speed interface pattern. However, Tx data channels in Hall's pattern must be positioned parallel to Rx data channels to convey data from the transmitter out to the host. Parallel Tx/Rx channels tend to degrade data signals and increase error rates. In Hall's Tx/Rx pattern, the data line transporting a high speed Tx signal must cross over an Rx data line before exiting the PC board. Such proximity of Rx contacts to Tx contacts contributes to noise coupling between Tx and Rx signals. Thus, Hall does not resolve the problem of Inter Signal Interference (ISI) for high speed data links.

Accordingly, there is a need for an IC device layout that takes into account the routing delay for high speed data signals on a PCB or a SOC. In addition, a need exists for simplified data path routing for high speed networking devices to minimize the routing length through the silicon die. Further, a need exists for reducing the amount of interference between Rx and Tx signals while easing printed circuit board layout.

SUMMARY

The present invention provides a layout for a semiconductor device coupled to a second device. To optimize the high speed transmission rates in the present invention, at least two functional circuit blocks ("IP cores") are symmetrically located with respect to a central axis on a semiconductor die; each core being accessible via a plurality of Tx and Rx data lines. A serial interface is centered on the die between the two IP cores. The serial interface includes multiple ports which serve as nodes coupled to various data lines. In particular, the serial interface includes multiple transmitter ports and multiple receiver ports. The ports are coupled together by Tx data lines and Rx data lines. The die itself has multiple metal layers and is encapsulated in a package having multiple routing layers.

The present invention is also directed to a semiconductor device coupled to a second device, where the semiconductor device contains a die divided into two partitions. An IP core is contained in each partition. Further, multiple receiver terminals are located in the first partition of the die, and multiple transmitter terminals are located in the second partition of the die. A serial interface is further incorporated on the die and is positioned adjacent to one of the IP cores, wherein the serial interface includes transmitter ports and receiver ports. The IC device also includes Tx data lines, originating from respective Tx ports wherein each Tx port serializes and transmits a serial data signal for output on a Tx data line to one of said IP cores; and Rx data lines, originating from respective receiver ports, wherein each receiver port receives and deserializes a serial data signal for output on an Rx data line to one of said IP cores.

Another embodiment of the invention is directed to a stacked die that includes multiple dies attached together. At least one die in the stack assembly has Rx terminals in a first partition of the die and Tx terminals in a second partition of the die. At least one of the dies in the stack has a serial interface in a central region of the chip layout. Thus, it is not necessary for all the dies in the stack assembly to have the same chip layout as the die of the present invention.

The invention is also directed to a stacked die assembly that operates with reduced power, and propagation delay. By centrally locating the SERDES interface on the top surface of the die the driving distance is reduced by approximately one half. The reduced driving distance correlated to the layout of the invention reduces the system latency as well as power.

Other features of the invention will be described in connection with the accompanying drawings.

DETAILED DESCRIPTION

Figure 1:
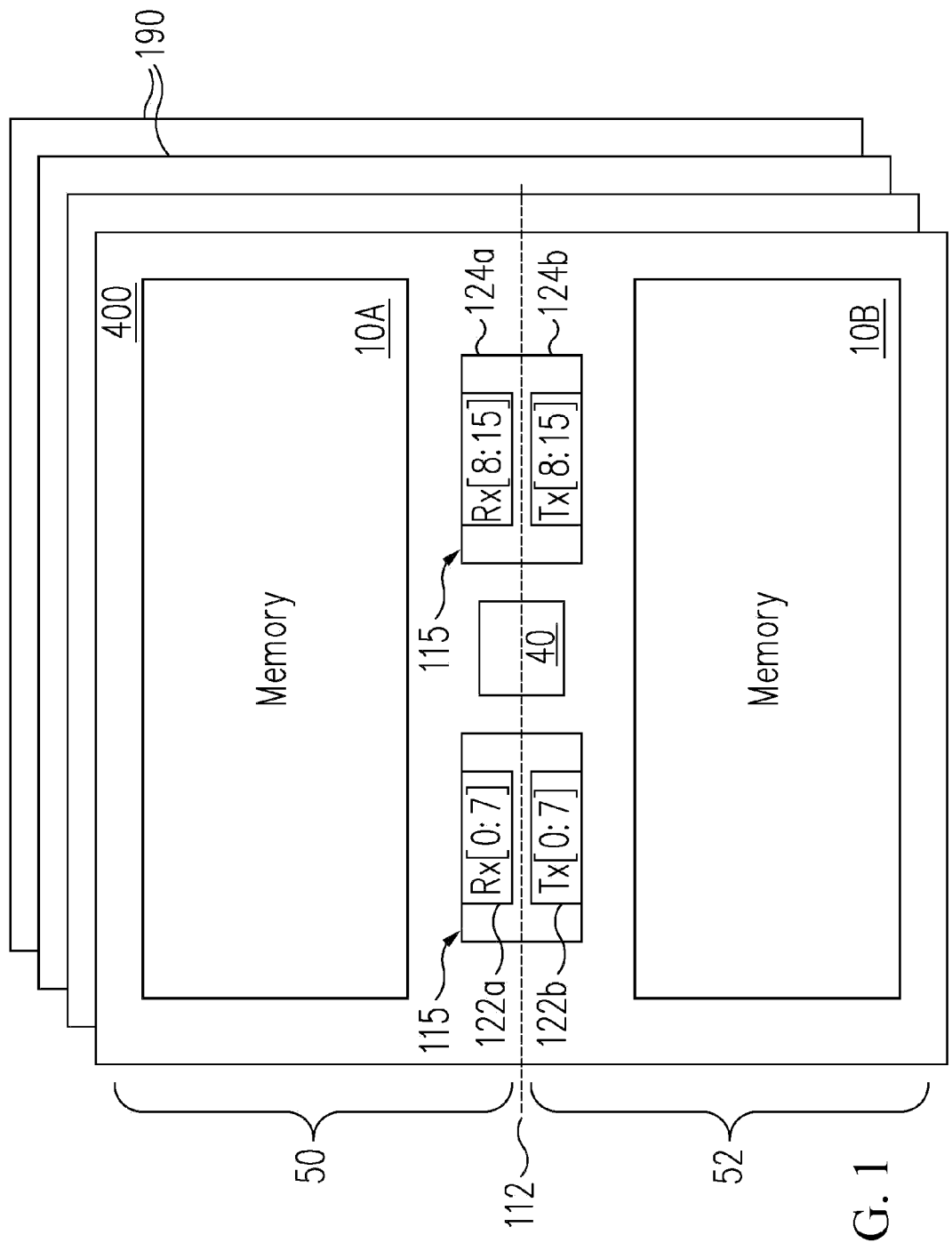
FIG. 1 illustrates a device layout that includes a memory block and a SERDES interface.

The present invention balances the access time and propagation delays for a signal entering a die across all physical corners of the silicon. This is achieved by providing a SERDES interface in the center of the die. FIG. 1 illustrates a die layout of the present invention divided by an axis 112 into an upper partition 50 and a lower partition 52. Each partition of the die layout contains an IP core 10A, 10B that is either a memory array, programmable logic array or network processor block. The memory core 10A, 10B may be either an SRAM, DRAM, 1T-SRAM or Flash. A serial interface 115 is positioned on axis 112 between the two IP cores 10A, 10B with serial interface 115 having Receiver/Transmitter (Rx/Tx) units 122a, 124a / 122b, 124b, respectively. In a preferred embodiment, when partitions 50, 52 have an equal area, axis 112 is centrally located on semiconductor die 400. However, in other embodiments, axis 112 can be shifted so that the SERDES interface is positioned off center on die surface 400. The serial interface contains one or more SERDES blocks. The semiconductor die of this invention has multiple metal layers 190, upon which are various circuit patterns.

It is not necessary for the IP cores of the present invention to have the same function or to be limited to memory blocks. In all embodiments, at least one IP core (functional block) is located in each partition. In one embodiment, each partition may constitute an equivalent half, that is, each partition may have the same area. However, it is not necessary that the partitions of the present invention have the same area as illustrated in FIG. 1.

Figure 2:
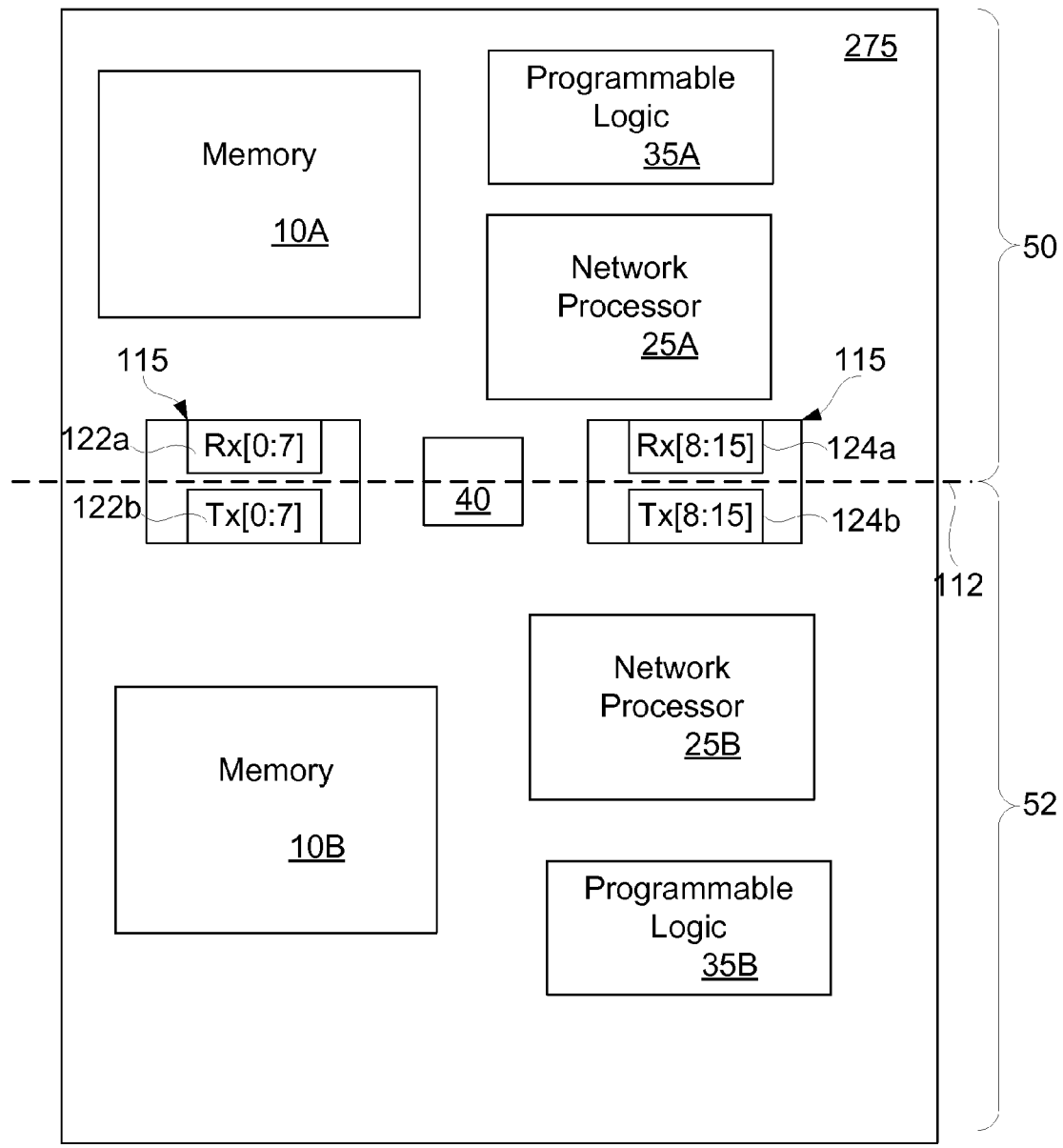
FIG. 2 illustrates a device layout that includes multiple functional blocks and a SERDES interface.

FIG. 2 illustrates an alternate chip layout where partition 50 has a smaller area than partition 52. In FIG. 2 more than two IP cores are arranged on die 275. In the upper partition 50 of substrate 275 is mounted memory core 10A, logic core 35A and network processor 25A. The lower partition 52 of substrate 275 contains memory core 10B, logic core 35B, and network processor 25B. The layout of FIG. 2 also includes a memory access controller and/or error detection software 40. Each pair of IP cores is preferably symmetrically located about axis 112. Along axis 112 is positioned a SERDES interface composed of two SERDES blocks 115.

Each SERDES block 115 contains Rx/Tx unit 122a, 124a / 122b, 124b, respectively. Each Tx port in Tx unit 122b, 124b contains a differential pair of transmitters, the transmitter pairs are grouped with the transmitters of the same Tx unit. Each Rx port in Rx unit 122a, 124a contains a differential pair of receivers that are isolated from the Tx ports in Tx unit 122b, 124b. In addition, each Tx port and each Rx port has clocking functionality to implement a PLL circuitry. Although 16 Tx ports and 16 Rx ports are shown, the present invention is also applicable to a SERDES block that has a different number of Tx/Rx ports. Preferably, the Rx ports in Rx units 122a, 124a occupy a portion of the upper partition 50 of the die layout and the Tx ports in Tx unit 122b, 124b occupy a lower partition 52 of the die layout. By placing the SERDES block in approximately the center of the die, the distance of the data access from opposite edges of the die is more uniform than in the prior art. As a result, the layout of the present invention provides a symmetrical or nearly symmetrical point of entry for each data signal.

Figure 3A:
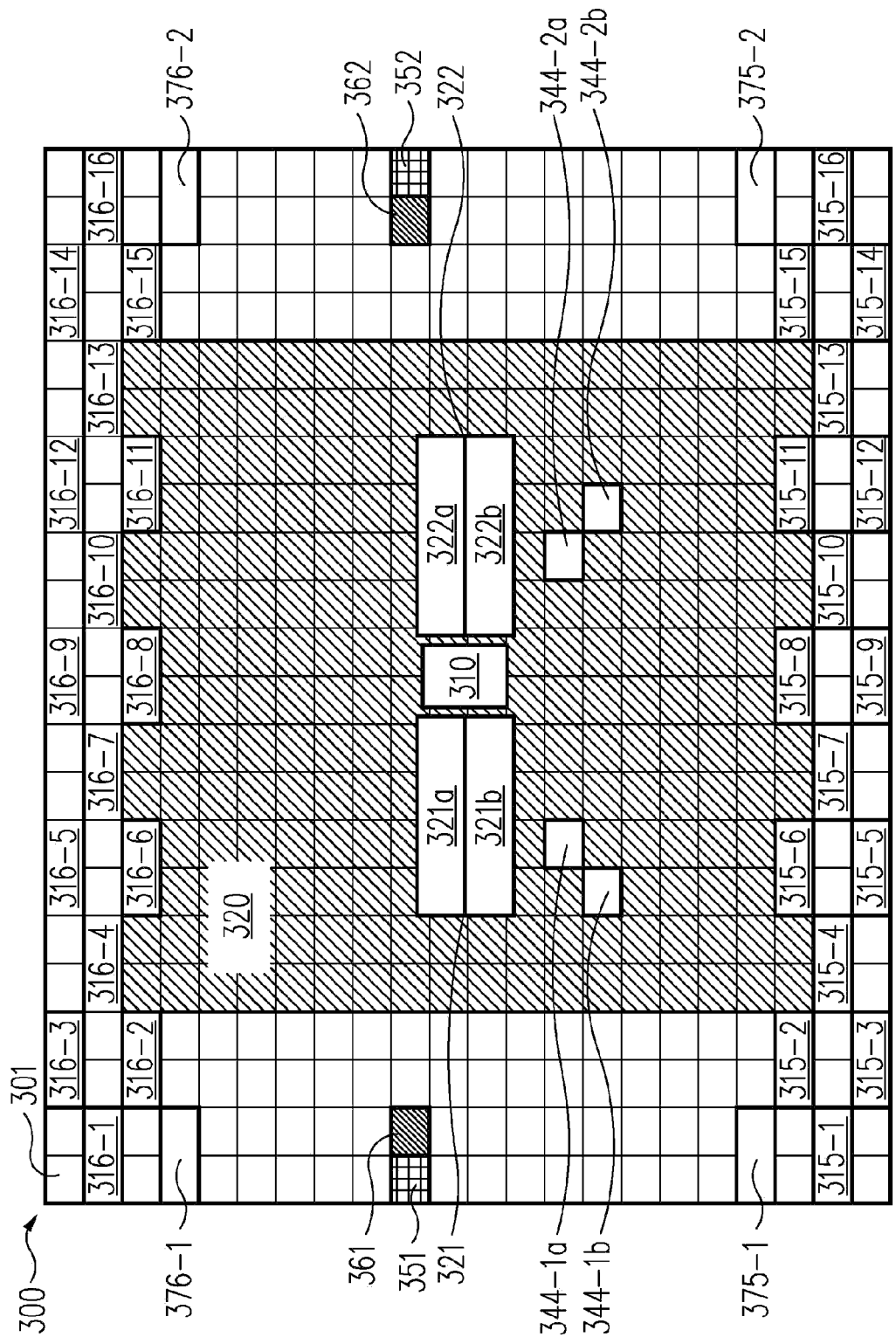
FIG. 3A illustrates a package layout for the embodiment of FIG. 1.

FIG. 3A illustrates a more detailed layout of the invention. Elements 316-1 to 316-16 correspond to Rx terminals, whereas elements 315-1 to 315-16 correspond to Tx terminals. The Tx terminals are separated from the Rx terminals. Terminals refer to nodes on the edge of a package that are coupled to data lines. In addition, the present invention provides connections to Rx/Tx ports inside a serial interface on the die. The ports are equidistant from the four corners of the die substrate to a central region on the die.

FIG. 3A shows the layout of package substrate 300 in an integrated circuit memory device according to some embodiments of the present invention. Package substrate 300 may be divided into a number of divisions 301 forming an M×N matrix. According to the embodiment of FIG. 3A, there are M (=22)×N (=22) divisions 301 in package substrate 300. Other values for M and N may be used instead of a 22×22 matrix. Further, the values of M and N need not be the same. Divisions 301 of package substrate 300 may overlap different area portions of die substrate 400 which may include functional components ("blocks") formed in circuit substrate 400. For example, the divisions in the shaded portion 320 of FIG. 3A may overlap various functional blocks formed in die substrate 400. Such functional blocks may include logic and memory circuits, as well as memory arrays 10A and 10B, coupled to SERDES circuits 115, and CRC circuit 40 of FIG. 1, which shows a layout of die substrate 400. While the embodiment depicted in FIG. 1 includes two memory arrays and two SERDES circuits, some embodiments of the present invention may use a different number of memory arrays and SERDES circuits. The divisions 301 in portion 321 (322) of package substrate 300 overlap first (second) SERDES circuit 115. The divisions 301 in portion 310 of package substrate 300 overlap CRC circuit 40 (FIG. 1), according to the embodiment depicted in FIG. 3A. Specifically, a given division 301 in package substrate 300 may overlap more than one functional component formed in die substrate 400. Also within shaded portion 320, divisions 344-1a (344-2a) and 344-1b (344-2b) may be coupled to conducting balls providing a signal or power to a sensitive circuit like a PLL (phase-locked loop) circuit in substrate 400. Portion 321 (322) may include receiver portion 321a (322a) overlapping receiver unit 122a (124a) in SERDES 115 of FIG. 1. Portion 321 (322) may also include transmitter portion 321b (322b) overlapping transmitter unit 122b (124b) in SERDES 115 of FIG. 1. Outside and along the edges of shaded portion 320 of package substrate 300, according to the embodiment shown in FIG. 3A, portions 315-1 to 315-16 and portions 316-1 to 316-16 may be provided. Portions 315-1 to 315-16 overlap divisions 301 of package substrate 300 that may be coupled to Tx data channels 550-1 to 550-16 of package substrate 300 (see, FIG. 3B) through conducting balls 215, according to some embodiments of the present invention. Portions 316-1 to 316-16 overlap divisions 301 of package substrate 300 coupled to Rx data channels 552-1 to 552-16 (see, FIG. 3B) through conducting balls 216. Some of the divisions (e.g. 351 and 352) in package substrate 300 may be coupled to a biasing voltage for die (circuit) substrate 400, associated with a ground voltage provided through divisions 361 and 362, respectively.

Portion 375-1 (375-2) may be used to provide an extra Tx data channel 551-1 (551-2) (see, FIG. 3B) to integrated circuit 100. Likewise, portions 376-1 (376-2) overlap divisions 301 in package substrate 300 that may provide an extra Rx data channel 553-1 (553-2) (see, FIG. 3B) to integrated circuit 100.

Figure 3B:
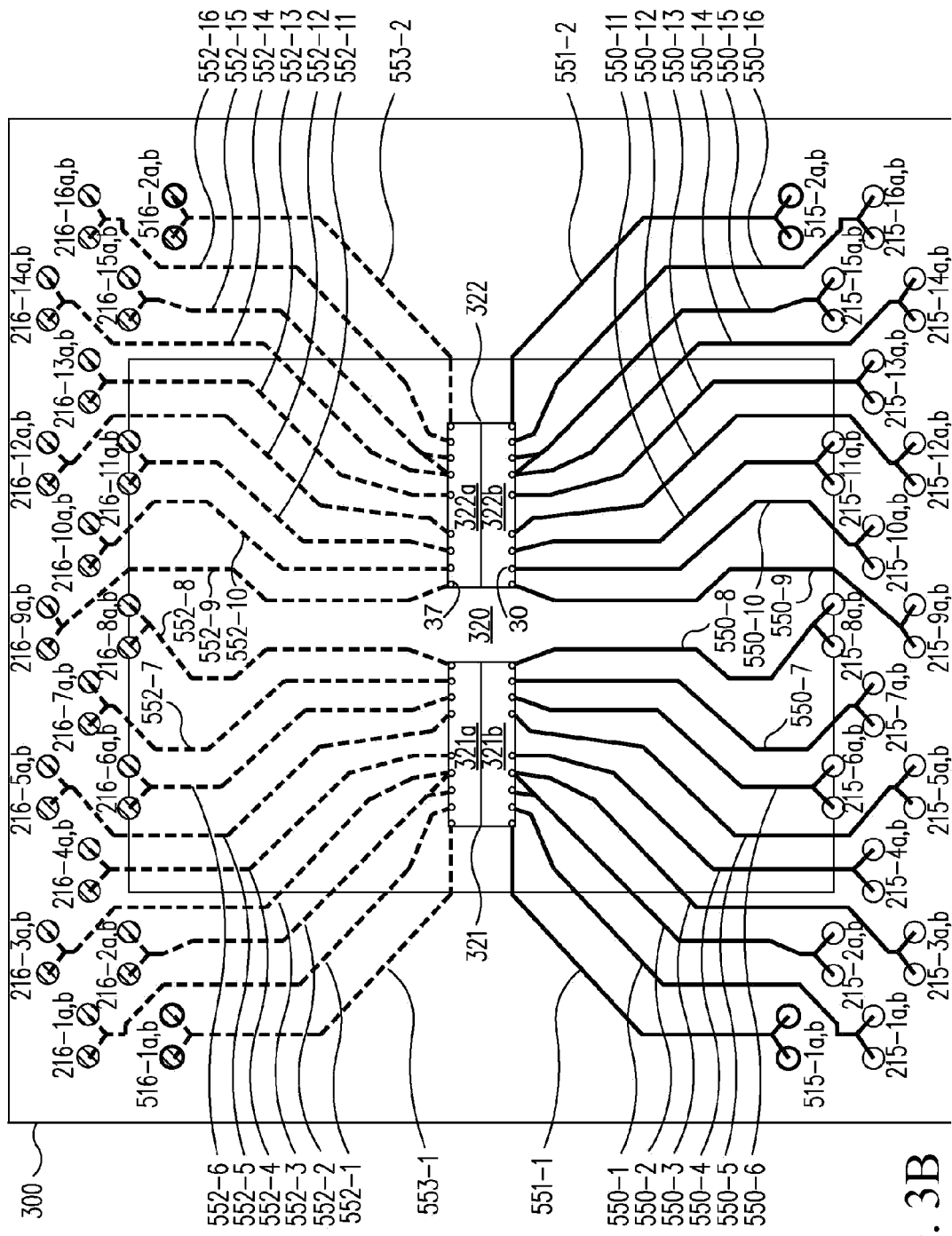
FIG. 3B illustrates the package layout of FIG. 3A with conductor traces.

FIG. 3B is a layout of package substrate 300 showing the positions of conducting balls 215-1a, 215-1b to 215-15a, 215-15b, 216-1a, 216-1b to 216-15a, 216-15b, coupled to package substrate 300. Also shown are conducting balls 515-1a, 515-1b, 515-2a, 515-2b, 516-1a, and 516-1b, and 516-2a, 516-2b coupled to package substrate 300. Also shown in FIG. 3B are Rx data lines 552-1 to 552-16, 553-1 and 553-2, and Tx data lines 550-1 to 550-16, 551-1 and 551-2 in package substrate 300, according to some embodiments of the present invention. By using Tx/Rx data lines in package substrate 300 as shown in FIG. 3B, the latency of a memory array for a data line in a package substrate having a length of approximately 8-10 mm according to the embodiment depicted in FIG. 3B may be less than 100 picoseconds, and more preferably, the latency is less than 70 picoseconds (ps) or less within the package substrate. By comparison, the latency for a Tx/Rx data line in the prior art carrying data signals from one edge of a die to the opposite edge of the die within a silicon substrate may have a latency ten times greater than the present invention, or about 2.4 ns.

In the present invention, a Tx signal will take longer to travel from bump 30 in the serial interface 322b through the die (400 of FIG. 1) to the die edge than to travel from serial interface 322b through the package substrate 300 and out to ball 215-10a, b (which is the edge of the package). In other words, it is faster in the present invention to route a signal through the package than to transport a signal from the serial interface 322b through the die (400 of FIG. 1) out to the edge of the silicon die, and then to travel through the package from the die edge to ball 215-10a, b. Similarly, it is faster to route an Rx signal from the package edge at 216-9a, b through the package substrate 300 to the bump 37 in the serial interface 322a than to travel from ball 216-9a, b to the die edge and then through the die (400 of FIG. 1) to bump 37.

Conducting balls 216-1a,b to 216-16a,b are coupled to Rx data lines 552-1 to 552-16; conducting balls 516-1a,b are coupled to Rx data line 553-1; and conducting balls 516-2a, 516-2b are coupled to Rx data line 553-2. Conducting balls 215-1a, 215-1b to 215-16a, 215-16b are coupled to Tx data lines 550-1 to 550-16; conducting balls 515-1a, 515-1b are coupled to Tx data line 551-1; and conducting balls 515-2a, 515-2b are coupled to Tx data line 551-2. All other elements in FIG. 3B are as described in detail in FIG. 3A above. According to some embodiments of the present invention, Rx data lines 552-1 to 552-16, 553-1, 553-2, and Tx data lines 550-1 to 550-16, 551-1, 551-2 may carry their respective signals as differential signals.

A semiconductor device that contains the layout of the present invention will be referred to in this description as a Bandwidth Engine (BE) device. The problems overcome by adopting the layout of the BE device will be explained in reference to the prior art system of FIGS. 4A and 4B.

Figure 4A:
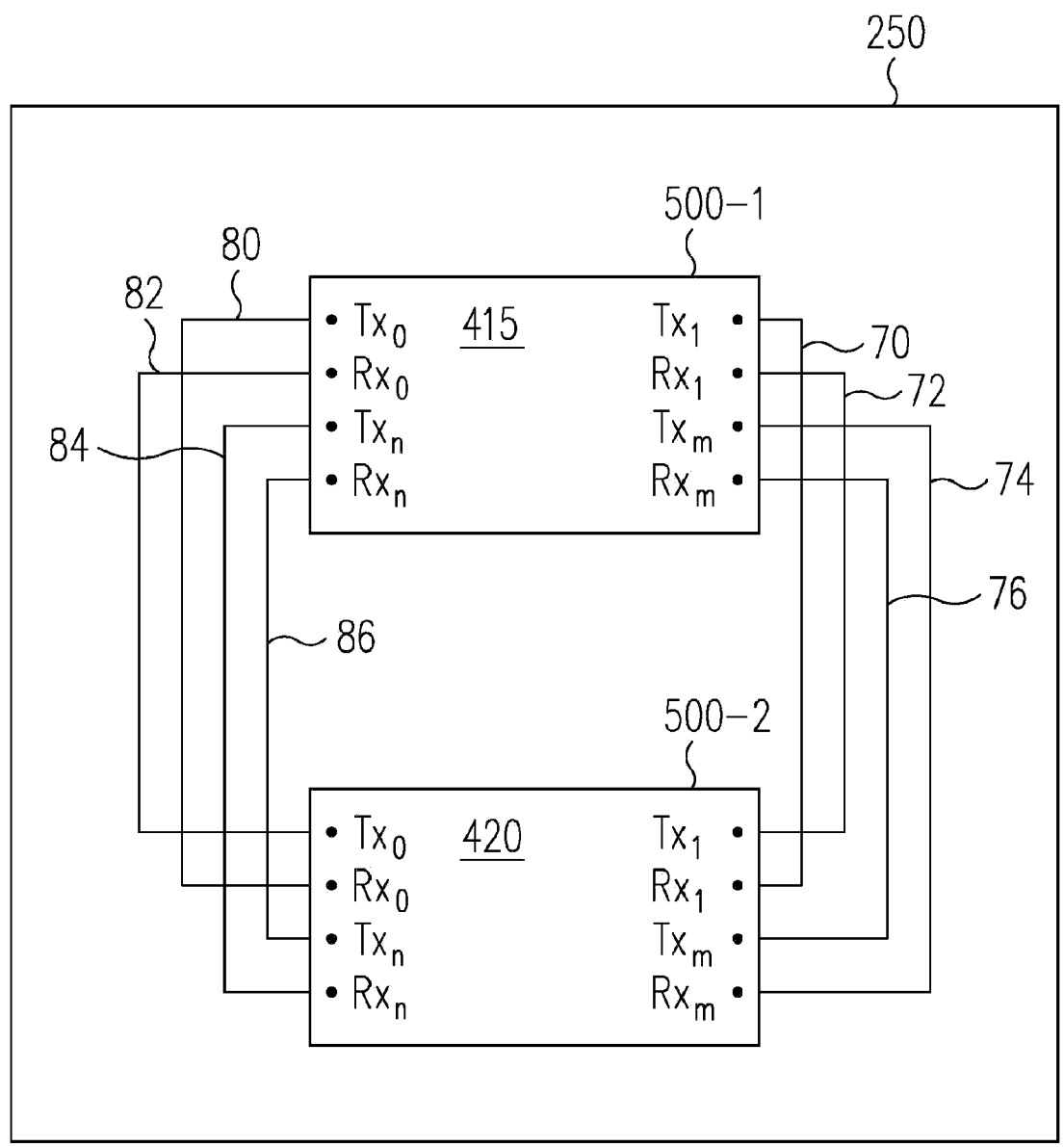
FIG. 4A illustrates a conventional routing pattern for two ICs mounted on a printed circuit board.

FIG. 4A includes two conventional ICs on a board 250. IC 415 is coupled to IC 420. The terminals Tx/Rx of devices 415 and 420 are arranged in pairs on the peripheral edges of their packages. On lateral edges of IC 415, Tx/Rx pairs are $Tx_0/Rx_0$, $Tx_n/Rx_n$, and $Tx_1/Rx_1$, $Tx_m/Rx_m$. IC 420 has a similar arrangement of Tx/Rx pairs, namely, $Tx_0/Rx_0$, $Tx_n/Rx_n$, and $Tx_1/Rx_1$, $Tx_m/Rx_m$.

Data line 70 in FIG. 4A must cross over three data lines 72, 74 and 76 in order to couple $Tx_1$ terminal on IC 415 to $Rx_1$ terminal on IC 420. Similarly, Tx data line 84 must cross over data lines 80 and 82 in order to couple to $Tx_n$ terminal on IC 415 to $Rx_n$ terminal on chip 420. Every data line in FIG. 4A must cross over one or more data lines of an adjacent terminal. Such crossover can lead to noise coupling. The present invention reduces data line cross over by grouping Tx terminals separately from Rx terminals on the lateral edges of a chip and by isolating Tx ports from Rx ports in the serial interface of the chip layout.

Figure 4B:
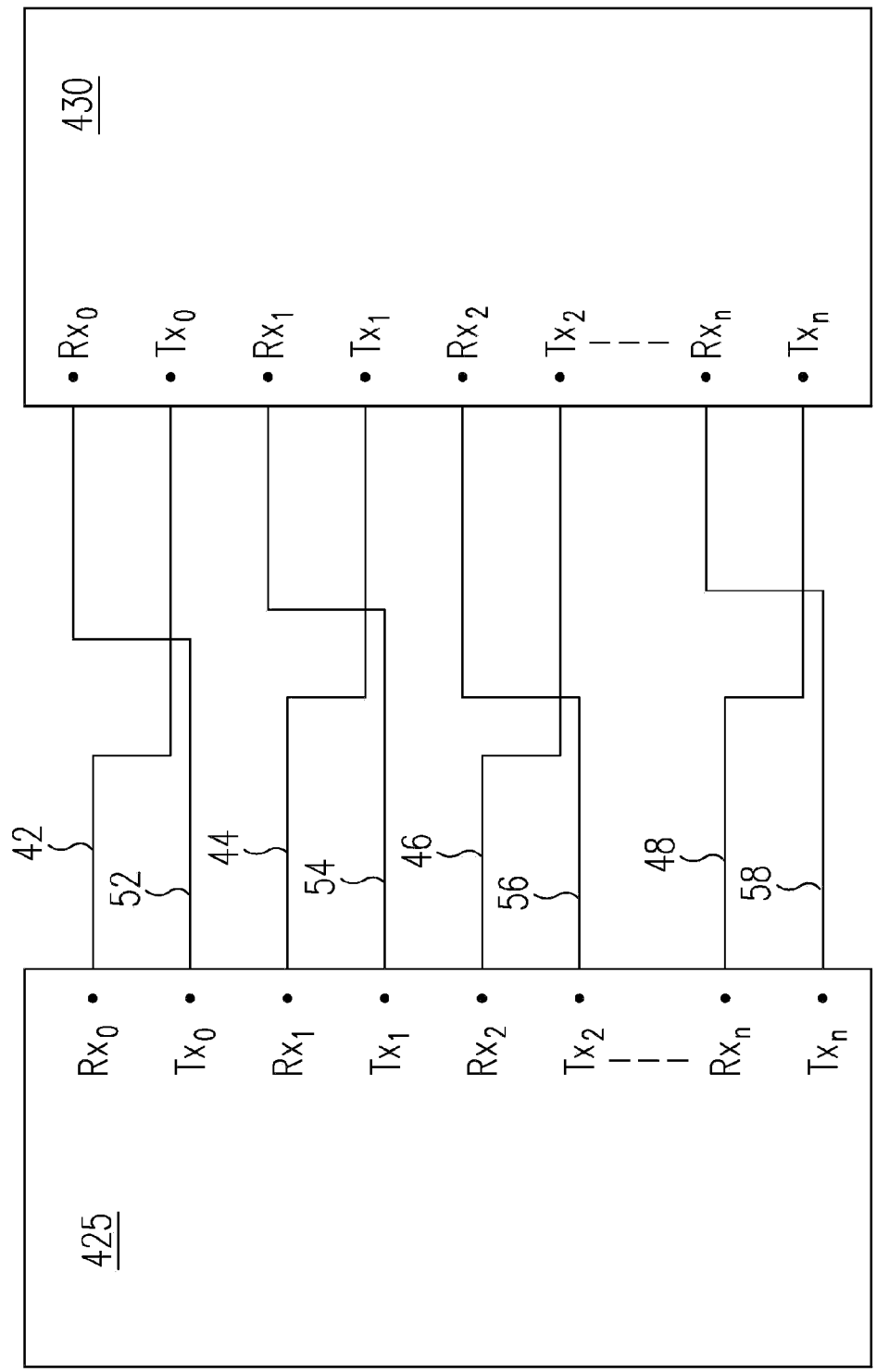
FIG. 4B illustrates the extensive crossover problem that occurs when two conventional chips are positioned next to each other.

FIG. 4B illustrates the extensive crossover problem that occurs when two conventional chips are positioned next to each other. Data lines couple IC 425 to IC 430. Rx data lines 42, 44, 46, 48 in FIG. 4B must cross over an adjacent Tx data line to connect an Rx terminal on IC 425 to a Tx terminal on IC 430. Similarly, Tx data lines 52, 54, 56 and 58 in FIG. 4B must cross over an adjacent Rx data line for a TX terminal on IC 425 to connect to an Rx terminal on IC 430. The problems of FIGS. 4A and 4B are overcome by separating the Rx terminals from the Tx terminals.

Figure 5A:
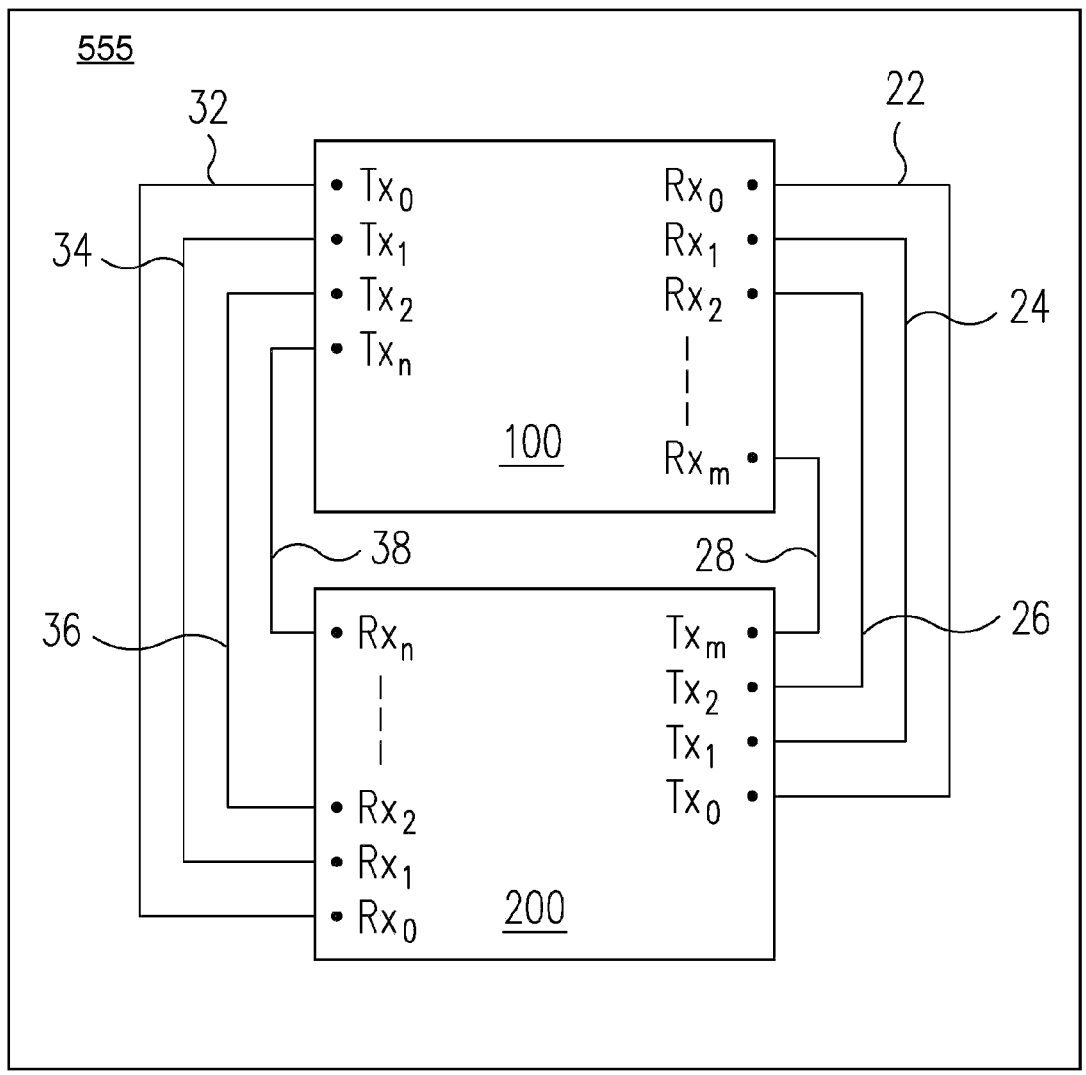
FIG. 5A illustrates a routing pattern for two BE devices mounted on a printed circuit board.

The present invention will be further explained in reference to FIG. 5A. FIG. 5A illustrates two BE devices 100 and 200 on substrate 555. Specifically, chip 100 is shown as positioned above chip 200. The two BE devices are coupled via multiple data lines 32-38 and 22-28. For simplicity, data lines originating from Rx terminal on chip 100 are referred to as Rx data lines, and data lines originating from Tx terminals on chip 100 are referred to as Tx data lines. Tx terminals ($Tx_0$, $Tx_1$, $Tx_2$, ... $Tx_n$) on chip 100 are isolated from Rx terminals ($Rx_0$, $Rx_1$, $Rx_2$, ... $Rx_m$). Similarly, Tx terminals ($Tx_0$, $Tx_1$, $Tx_2$, ... $Tx_m$) on chip 200 are isolated from Rx terminals on the same chip ($Rx_0$, $Rx_1$, $Rx_2$, ... $Rx_n$). Data line 22 is shown connected at one end to $Rx_0$ terminal 14 of chip 100, and at the other end to chip 200 via $Tx_0$ terminal. In operation, each Tx terminal $Tx_0$, $Tx_1$, $Tx_2$, ... $Tx_n$ of device 100 serializes and transmits a serial data signal for output on a Tx data line to an IP core on device 200. Meanwhile, each Rx terminal $Rx_0$, $Rx_1$, $Rx_2$, ... $Rx_m$ on device 100 receives and deserializes a serial data signal for input on an Rx data line to an IP core on device 100. Data line 32 couples $Tx_0$ terminal on chip 100 to $Rx_0$ terminal on chip 200. Thus, Rx terminals ($Rx_0$, $Rx_1$, $Rx_2$, ... $Rx_m$ and $Rx_0$, $Rx_1$, $Rx_2$, ... $Rx_n$) are segregated from Tx terminals ($Tx_0$, $Tx_2$, $Tx_2$, ... $Tx_m$ and $Tx_0$, $Tx_2$, $Tx_2$, ... $Tx_n$) on their respective chips. This segregation results in Tx data lines 32, 34, 36, 38 on chip 100 being nonadjacent to Rx data lines 22, 24, 26, 28 on chip 200. In addition, none of the Rx data lines need to cross over any other data line, including Tx data lines. Consequently, the layout of the Tx data lines and Rx data lines produces a simplified routing pattern. Further, by isolating the Tx terminals from Rx terminals as shown in FIG. 5A package 555 may include fewer routing layers. Since the Rx terminals are radially separated from the Tx terminals their respective data lines may traverse through the same routing layer. Alternatively, the latency advantages of the invention can also be attained by having Rx data lines traverse through a first routing layer and Tx data lines traverse through a second routing layer different from the first routing layer. The total number of package substrate layers will vary depending on the number of power and ground layers needed for the particular product that incorporates the devices of the present invention.

Figure 5B:
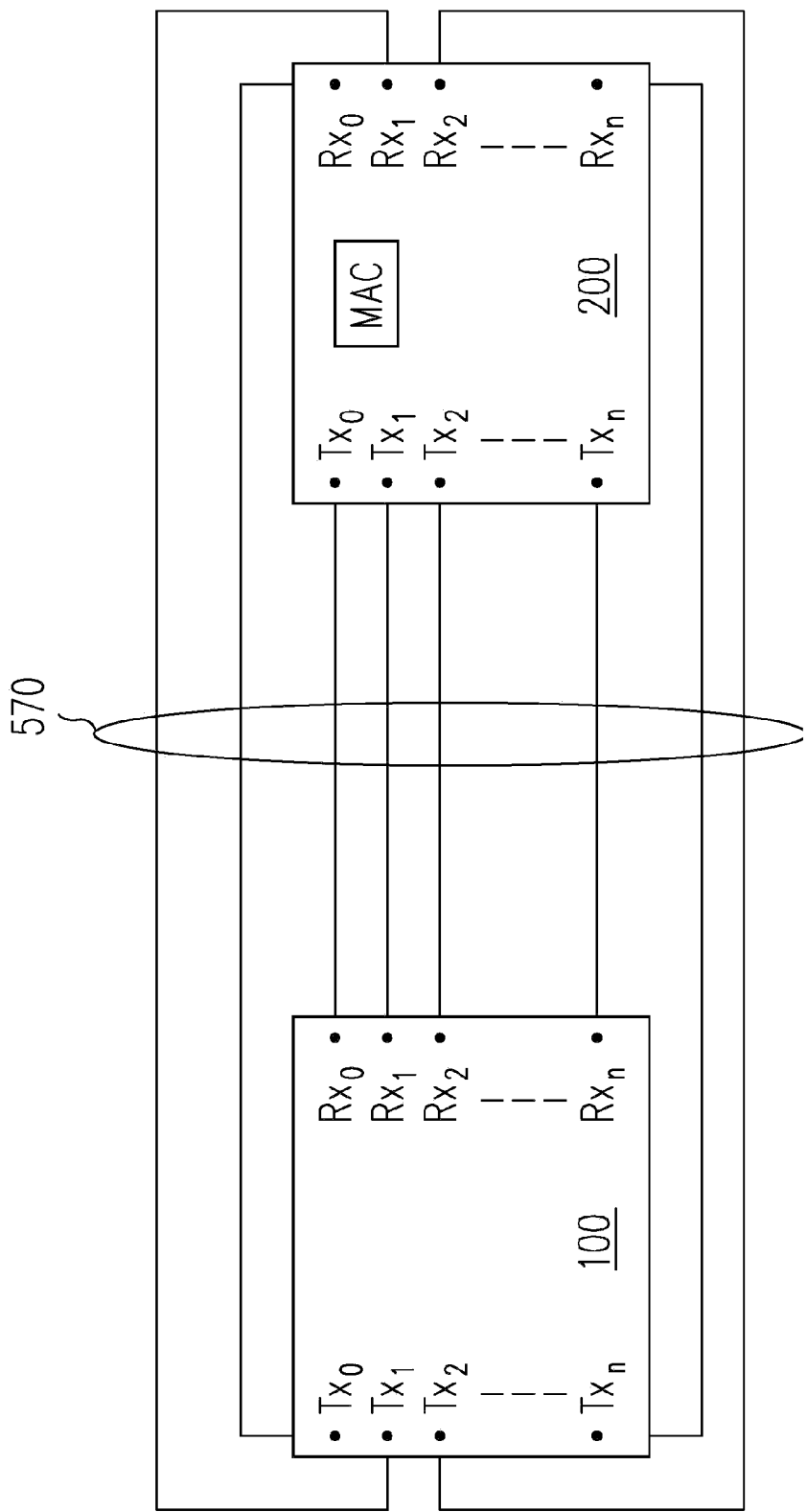
FIG. 5B illustrates an alternative routing pattern for two BE devices mounted on a printed circuit board.

The present invention may also be implemented by positioning chip 100 on either side of chip 200. For example, FIG. 5B illustrates an alternative embodiment in which chip 200 is positioned to the right of chip 100. Chip 100 is an IC device with Rx and Tx terminals grouped around a central axis (an example of Chip 100 is a BE device, however, Chip 100 need not necessarily be restricted to that of a BE device), while chip 200 may be either a BE device or a BE-compliant device. In FIG. 5B, chip 200 is a BE-compliant device and is shown with a memory access controller (MAC). In the configuration of FIG. 5B, none of data lines 570 cross over any other data line. As a result, parallel crosstalk is substantially reduced in the present invention, which enables Tx data lines and Rx data lines to be provided in a single routing layer. The IC device architecture of the present invention also benefits systems that contain devices with an architecture dissimilar to the IC devices of the present invention as will become obvious in reference to FIGS. 6A and 6B.

Figure 6A:
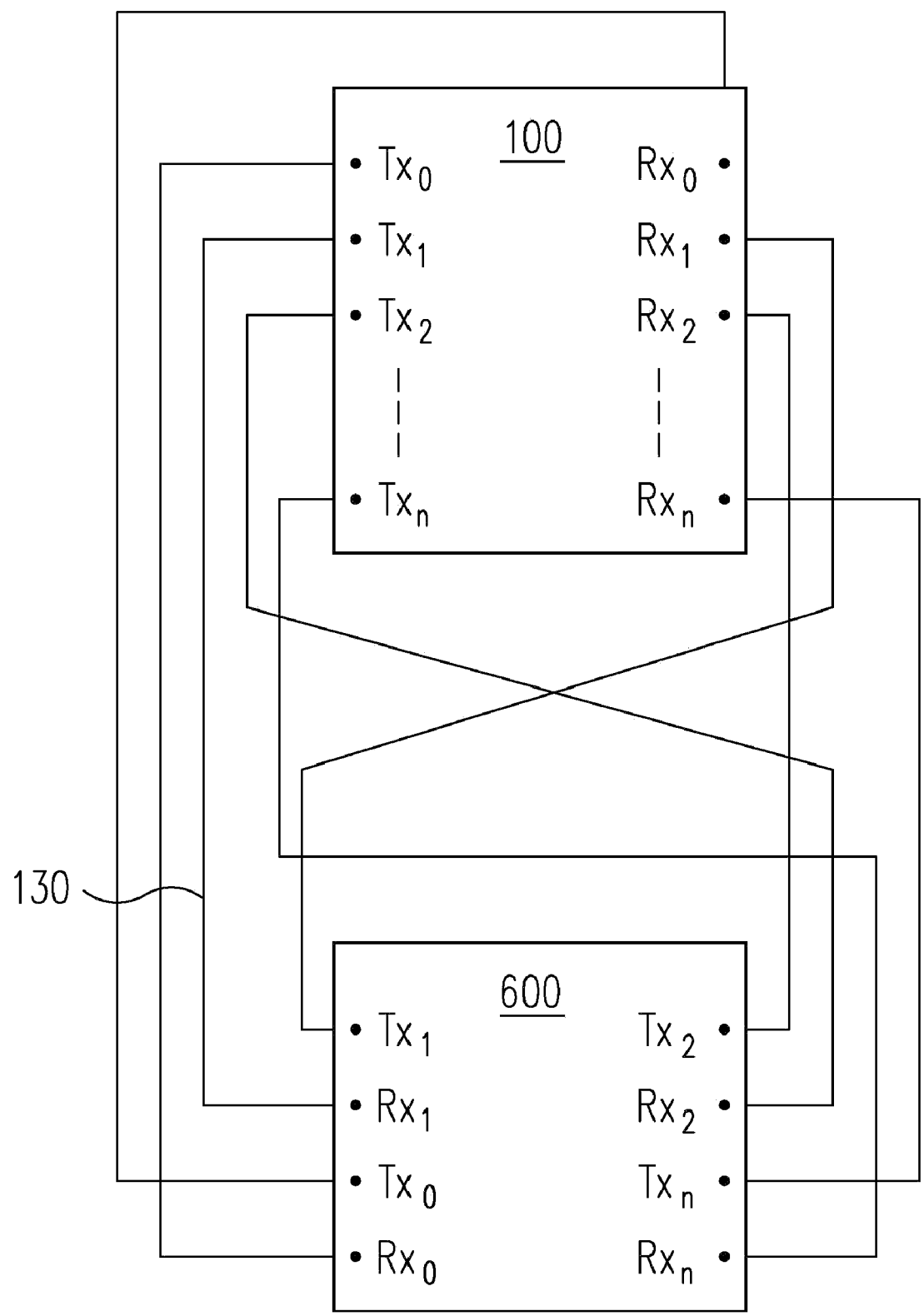
FIG. 6A illustrates a routing pattern of a BE device coupled to a conventional device on a printed circuit board with a minimal amount of crossover.
Figure 6B:
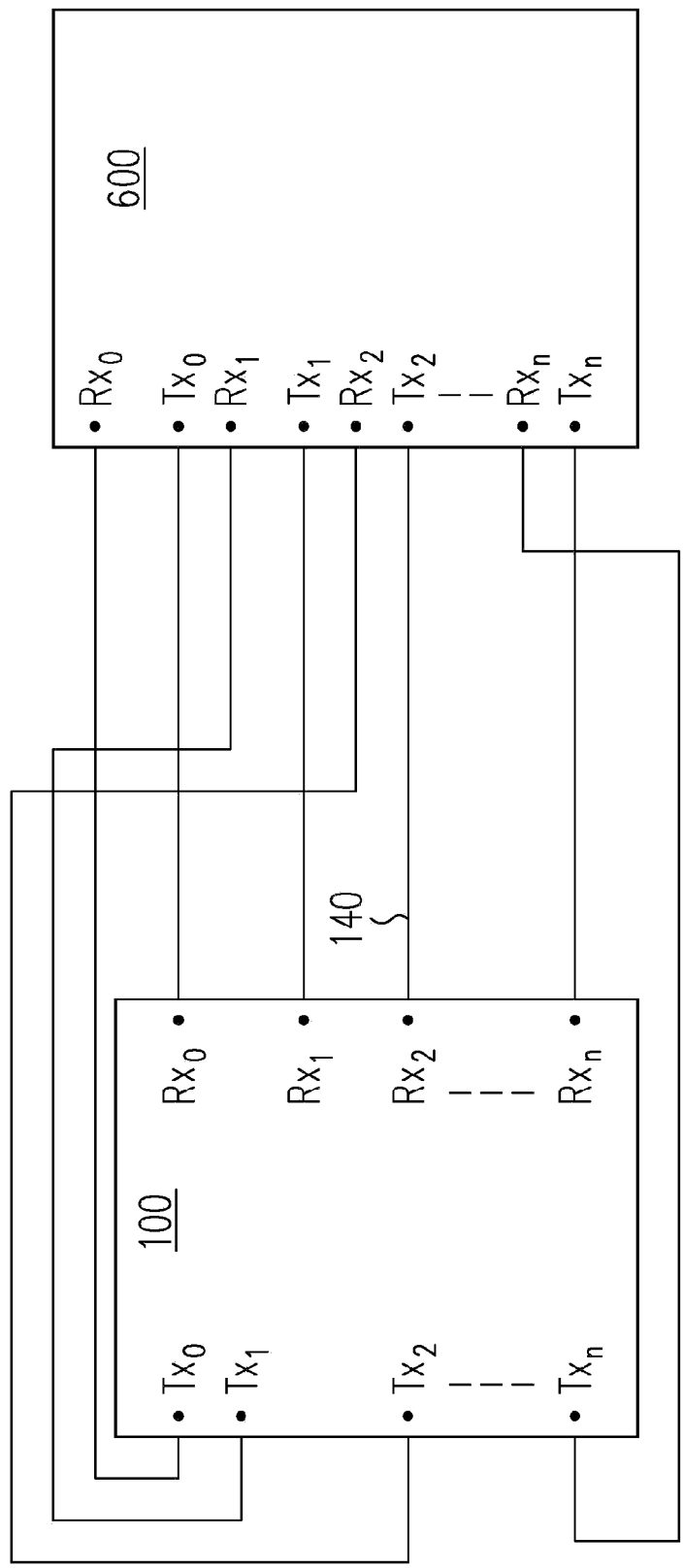
FIG. 6B illustrates an alternative routing pattern for the two devices of FIG. 6A.

FIG. 6A illustrates a BE device 100 coupled to IC 600 on board 150. IC 600 is a conventional IC device that does not have Tx/Rx terminals segregated in accordance with the present invention. FIG. 6B illustrates a conventional IC 600 positioned next to a BE device 100. Unlike FIGS. 5A and 5B, the system of FIGS. 6A and 6B contain at least one data line (130 and 140 respectively) that does not cross over an adjacent data line. Thus, Tx data lines in FIGS. 5A and 5B cross over only a minimal number of Rx data lines. Therefore when a BE device is coupled to a conventional chip the signal and data routing patterns are also improved over the prior art.

Figure 7:
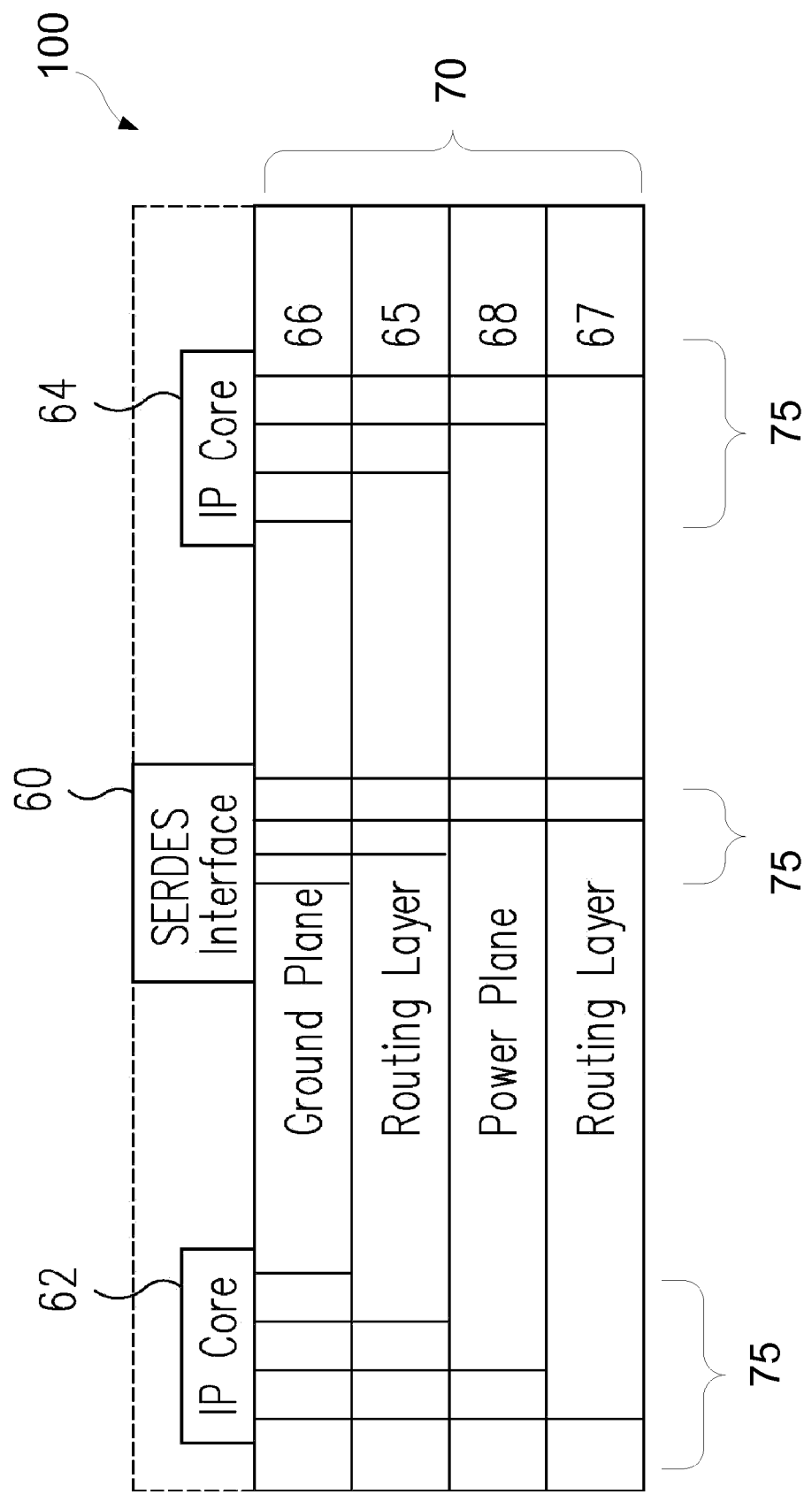
FIG. 7 illustrates a cross section of a semiconductor package of the present invention.
Figure 8:
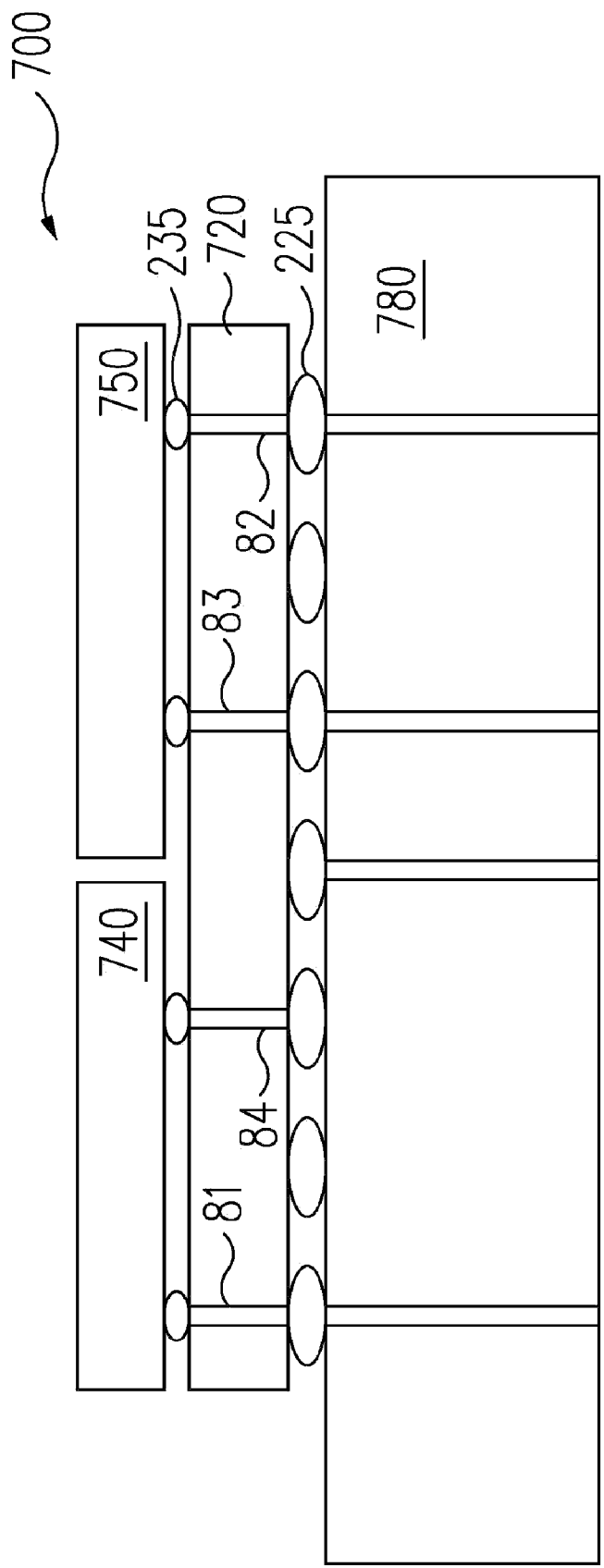
FIG. 8 illustrates a cross section of a stacked die assembly in accordance with one embodiment of the invention.

FIG. 7 illustrates a cross section of a package containing a multi-layer PCB and suitable functional blocks. SERDES interface 60 lies on the central axis, and is flanked by IP core 62 and IP core 64. Unlike the present invention, conventional packages contain anywhere from eight or more layers. In the present invention, BE device 100 has a PCB 70 that may contain as few as four layers since the signals over the Rx data lines are less likely to interfere with signals being transmitted over a Tx data line. In FIG. 7, PCB 70 includes a ground plane 66, power plane 68 and two routing layers 65, 67. Vias 75 couple the terminals on the upper surface of the package to routing layers 65 and 67. The chip layout of the present invention is also advantageous in a stacked die assembly. FIG. 8 illustrates one example of such an assembly. Package 700 is shown as including a BE device 720, which may be an ASIC. BE device 720 is connected to substrate 780 through balls 225. An adhesive is applied to second and third dies 740, 750 respectively to mount the dies to BE device 720. In a less preferred embodiment, dies 740, 750 may be wire bonded to BE device 720. Wirebonding is a less preferred way of connecting the stack because it will increase the propagation delay of the signals. Both dies 740 and 750 are coupled to BE device 720 through bumps 235, while BE device 720 is coupled to substrate 780 through conducting balls 225. Vias 81-84 in BE 720 allow IC 720 to communicate with dies 740 and 750. Similarly, substrate 780 is provided with conducting balls 311 that attach to a PCB. Dies 740 and 750 may contain either an ASIC, FPGA, CPU memory, or logic. Alternatively, dies 740 and 750 may have identical functions that provide BE device 720 with a new feature or an expanded memory capacity.

The present invention has been described by various examples above. However, the aforementioned examples are illustrative only and are not intended to limit the invention in any way. The skilled artisan would readily appreciate that the examples above are capable of various modifications. Thus, the invention is defined by the claims set forth below.

The invention claimed is:

1. An apparatus comprising:
   a package or substrate upon which a semiconductor device is mounted;
   a plurality of transmit (Tx) terminals individually and respectively coupled to a plurality of Tx data channels, disposed in or on the package, for transmitting serial data signals from the semiconductor device out through the Tx terminals; and
   a plurality of receive (Rx) terminals individually and respective coupled to a plurality of Rx data channels, disposed in or on the package, for communicating serial data signals from the Rx terminals in to the semiconductor device;
   wherein the plurality of Tx terminals are segregated from the plurality of Rx terminals by disposing only a Tx type of terminals or only an Rx type of terminals on a given edge or end of the package.

2. The apparatus of claim 1 wherein:
   a plurality of Tx terminals are coupled together for a given communication block and are grouped contiguously to each other on the package as a grouped set of Tx terminals;
   a plurality of Rx terminals are coupled together for the given communication block and are grouped contiguously to each other on the package as a grouped set of Rx terminals; and
   the grouped set of Tx terminals is segregated apart from the grouped set of Rx terminals to improve electrical performance of routing data signals on the package.

3. The apparatus of claim 2 wherein:
   the grouped set of Rx terminals are isolated from the grouped set of Tx terminals by having only Tx terminals in a first partition of the package, and having only Rx terminals in a second partition of the package; and
   the first partition and the second partition are defined by a straight-line axis drawn across a face of the package that mates with the semiconductor device.

4. The apparatus of claim 1 wherein the plurality of Rx terminals are radially separated from the plurality of Tx terminals.

5. The apparatus of claim 1 wherein:
   only an Rx type of terminals is disposed on a first edge or end of the package; and
   only a Tx type of terminals is disposed on a second edge of the package.

6. The apparatus of claim 5 wherein:
   the first edge is orthogonal to the second edge or the first edge is on an opposite side of the package from the second edge.

7. The apparatus of claim 5 wherein:
   the Tx data channels communicate a serial data signal from an approximate center of the package to the first edge of the package, and
   the Rx data channels communicate a serial data signal from the second edge of the package to the approximate center of the package.

8. The apparatus of claim 1 wherein the Rx data channels terminate at Rx ports and the Tx data channels originate at Tx ports, wherein the Rx ports and the Tx ports are located at an approximate center of the package.

9. The apparatus of claim 1 wherein the Rx data channels or the Tx data channels are disposed in a single layer of the package.

10. The apparatus of claim 1 wherein both the Rx data channels and the Tx data channels are disposed in a single layer of the package.

11. The apparatus of claim 1 wherein:
the Rx data channels are disposed in a first routing layer in the package;
the Tx data channels disposed in a second routing layer in the package; and
wherein the first routing layer is a different layer than the second routing layer.

12. The apparatus of claim 1 wherein:
a plurality of Tx ports is individually and respectively coupled to the plurality of Tx data channels;
a plurality of Rx ports are individually and respectively coupled to the plurality of Rx data channels;
both the Tx ports and the Rx ports are disposed approximately on, or adjacent to, an axis; and
the axis divides the package, by bisecting a top face of the package starting at a midpoint of a given edge of the package, approximately in half into a first partition and a second partition.

13. The apparatus of claim 12 wherein:
the plurality of Tx ports is disposed on a first side of the axis;
the plurality of Rx ports are disposed on a second side of the axis; and
the first side and the second side are opposite sides of the axis.

14. The apparatus of claim 12 wherein:
one or all of the serial data signals transmitted from the semiconductor device out to the Tx terminals flow in a first direction from an approximate center of the package toward a first edge of the package;
one or all of the serial data signals transmitted from the Rx terminals to the semiconductor device flow in a second direction from a second edge of the package to the approximate center of the package; and
the first direction is approximately in the same direction as the second direction with respect to the package.

15. An apparatus comprising:
a package or substrate upon which a semiconductor device is mounted;
a plurality of transmit (Tx) terminals individually and respectively coupled to a plurality of Tx data channels, disposed in or on the package, for transmitting serial data signals from the semiconductor device out through the Tx terminals; and
a plurality of receive (Rx) terminals individually and respective coupled to a plurality of Rx data channels, disposed in or on the package, for communicating serial data signals from the Rx terminals in to the semiconductor device;
wherein the plurality of Tx terminals are segregated from the plurality of Rx terminals by disposing only a Tx type of terminals or only an Rx type of terminals on a given edge or end of the package;
wherein the Rx data channels or the Tx data channels are disposed in a single layer of the package; or
wherein both the Rx data channels and the Tx data channels are disposed in a single layer of the package.

16. The apparatus of claim 15 wherein:
the Rx data channels are disposed in a first routing layer in the package;
the Tx data channels are disposed in a second routing layer in the package; and
wherein the first routing layer is a different layer than the second routing layer.

17. The apparatus of claim 15 wherein:
only the Rx type of terminals is disposed on a first edge or end of the package; and
only the Tx type of terminals is disposed on a second edge of the package.

18. An apparatus comprising:
a package or substrate upon which a semiconductor device is mounted;
a plurality of transmit (Tx) terminals individually and respectively coupled to a plurality of Tx data channels, disposed in or on the package, for transmitting serial data signals from the semiconductor device out through the Tx terminals;
a plurality of receive (Rx) terminals individually and respective coupled to a plurality of Rx data channels, disposed in or on the package, for communicating serial data signals from the Rx terminals in to the semiconductor device;
wherein the plurality of Tx terminals are segregated from the plurality of Rx terminals by disposing only a Tx type of terminals or only an Rx type of terminals on a given edge or end of the package;
a plurality of Tx ports is individually and respectively coupled to the plurality of Tx data channels; and
a plurality of Rx ports are individually and respectively coupled to the plurality of Rx data channels;
wherein:
both the Tx ports and the Rx ports are disposed approximately on, or adjacent to, an axis; and
the axis divides the package, by bisecting a top face of the package starting at a midpoint of a given edge of the package, approximately in half into a first partition and a second partition;
wherein:
the Rx data channels are disposed in a first routing layer in the package; and
the Tx data channels are disposed in a second routing layer in the package; and
wherein the first routing layer is a same layer or a different layer than the second routing layer.

19. The apparatus of claim 18 wherein:
only the Rx type of terminals is disposed on a first edge or end of the package; and
only the Tx type of terminals is disposed on a second edge of the semiconductor device.

20. The apparatus of claim 19 wherein:
the first edge is orthogonal to the second edge, or the first edge is on an opposite side of the package from the second edge.

* * * * *